United States Patent
Wenski et al.

(10) Patent No.: US 6,645,862 B2
(45) Date of Patent: Nov. 11, 2003

(54) DOUBLE-SIDE POLISHING PROCESS WITH REDUCED SCRATCH RATE AND DEVICE FOR CARRYING OUT THE PROCESS

(75) Inventors: Guido Wenski, Burghausen (DE); Johann Glas, Burghausen (DE); Thomas Altmann, Haiming (DE); Gerhard Heier, Burghausen (DE)

(73) Assignee: Wacker Siltronic Gesellschaft fur Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/989,550

(22) Filed: Nov. 20, 2001

(65) Prior Publication Data

US 2002/0115387 A1 Aug. 22, 2002

(30) Foreign Application Priority Data

Dec. 7, 2000 (DE) .......................... 100 60 697

(51) Int. Cl.[7] ............................................. H01L 21/302
(52) U.S. Cl. .................. 438/691; 438/692; 438/693
(58) Field of Search ................. 438/691, 692, 438/693; 156/345.12; 451/285, 287, 289

(56) References Cited

U.S. PATENT DOCUMENTS

| 4,974,370 A | | 12/1990 | Gosis ........................ 51/111 |
| 5,081,421 A | * | 1/1992 | Miller et al. ................ 324/671 |
| 5,605,499 A | * | 2/1997 | Sugiyama et al. .......... 451/443 |
| 5,643,405 A | * | 7/1997 | Bello et al. ............. 156/345.12 |
| 5,782,678 A | * | 7/1998 | Cesna et al. ................ 451/269 |
| 5,944,591 A | * | 8/1999 | Chen ........................ 451/290 |

(List continued on next page.)

FOREIGN PATENT DOCUMENTS

| DE | 197 15 974 | 10/1998 |
| DE | 198 17 087 | 11/1998 |
| DE | 199 05 737 | 12/2000 |
| DE | 100 23 002 | 11/2001 |
| EP | 0 208 315 | 9/1990 |
| EP | 0 959 116 | 11/1999 |
| EP | 0 787 562 | 12/1999 |
| WO | 00/39841 | 7/2000 |

OTHER PUBLICATIONS

English Derwent Abstract AN 1987–008979 corresponding to EP0 208 315.
English Derwent Abstract AN 2000–579981 corresponding to DE 199 05 737.
English Derwent Abstract AN 1998–583642 corresponding to DE 198 17 087.
Enlish Derwent Abstract AN 1998–558338 corresponding to DE 197 15 974.
English Abstract 2001:863137 corresponding to DE 100 23 002.

Primary Examiner—Benjamin L. Utech
Assistant Examiner—Lan Vinh
(74) Attorney, Agent, or Firm—Colard & Roe, P.C.

(57) ABSTRACT

A process for producing semiconductor wafers by double-sided polishing between two rotating, upper and lower polishing plates, which are covered with polishing cloth, while an alkaline polishing abrasive with colloidal solid fractions is being supplied, the semiconductor wafers being guided by carriers which have circumferential gear teeth and are set in rotation by complementary outer gear teeth and inner gear teeth of the polishing machine, which is distinguished by the following process steps:

(a) at least one of the two sets of gear teeth of the polishing machine is at least from time to time sprayed with a liquid which substantially comprises water, (b) the alkaline polishing abrasive is fed continuously to the semiconductor wafers in a closed supply device. There is also a device which is suitable for carrying out the process.

11 Claims, 5 Drawing Sheets

U.S. PATENT DOCUMENTS

| | | | |
|---|---|---|---|
| 6,027,669 A | | 2/2000 | Miura et al. .............. 252/518.1 |
| 6,080,042 A | * | 6/2000 | McGregor et al. ............ 451/41 |
| 6,083,419 A | * | 7/2000 | Grumbine et al. ......... 252/79.1 |
| 6,102,784 A | * | 8/2000 | Lichner ....................... 451/262 |
| 6,352,927 B2 | * | 3/2002 | Kishimoto .................. 438/690 |
| 6,475,062 B1 | * | 11/2002 | Kubota et al. ................. 451/5 |

\* cited by examiner

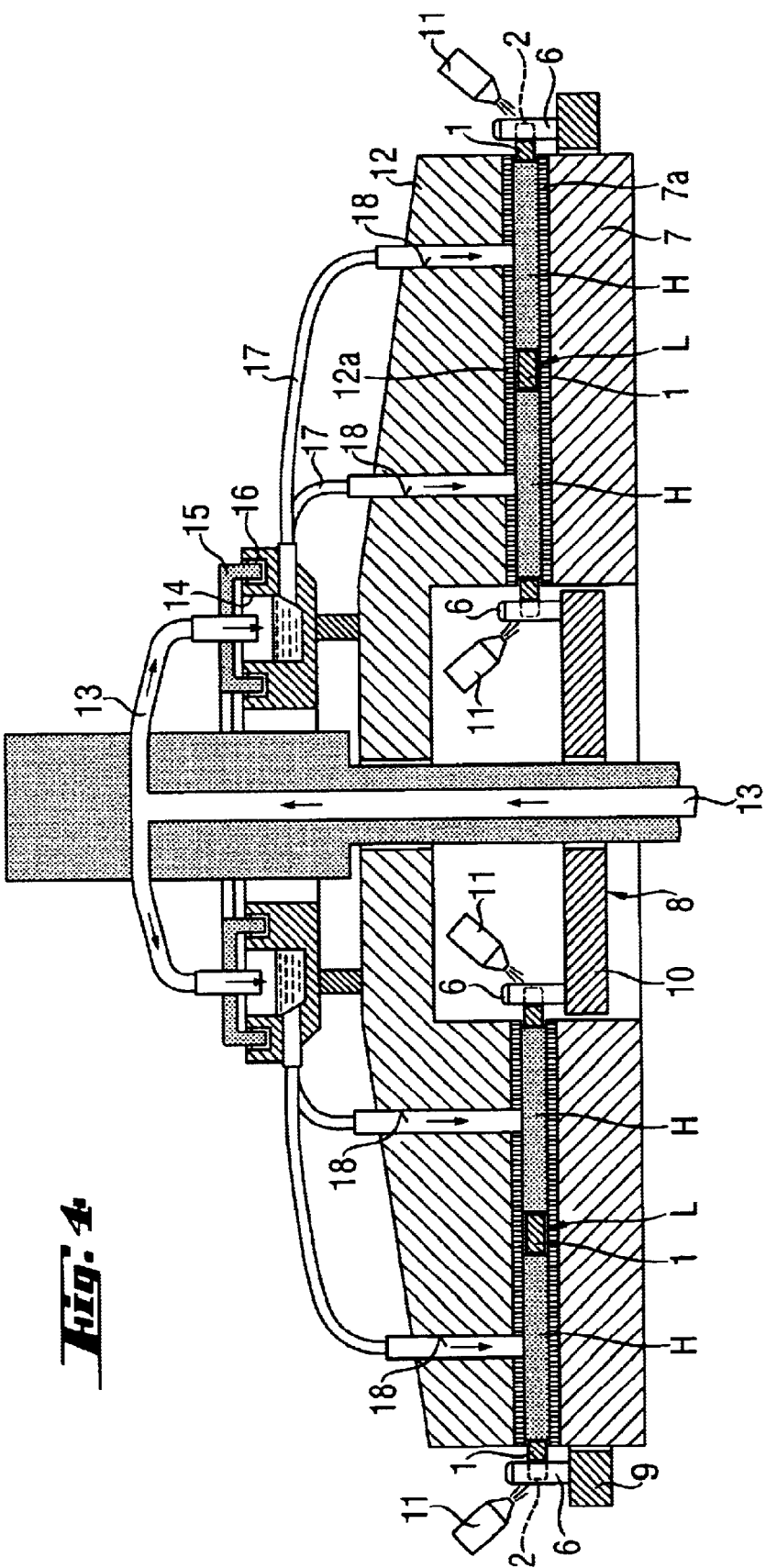

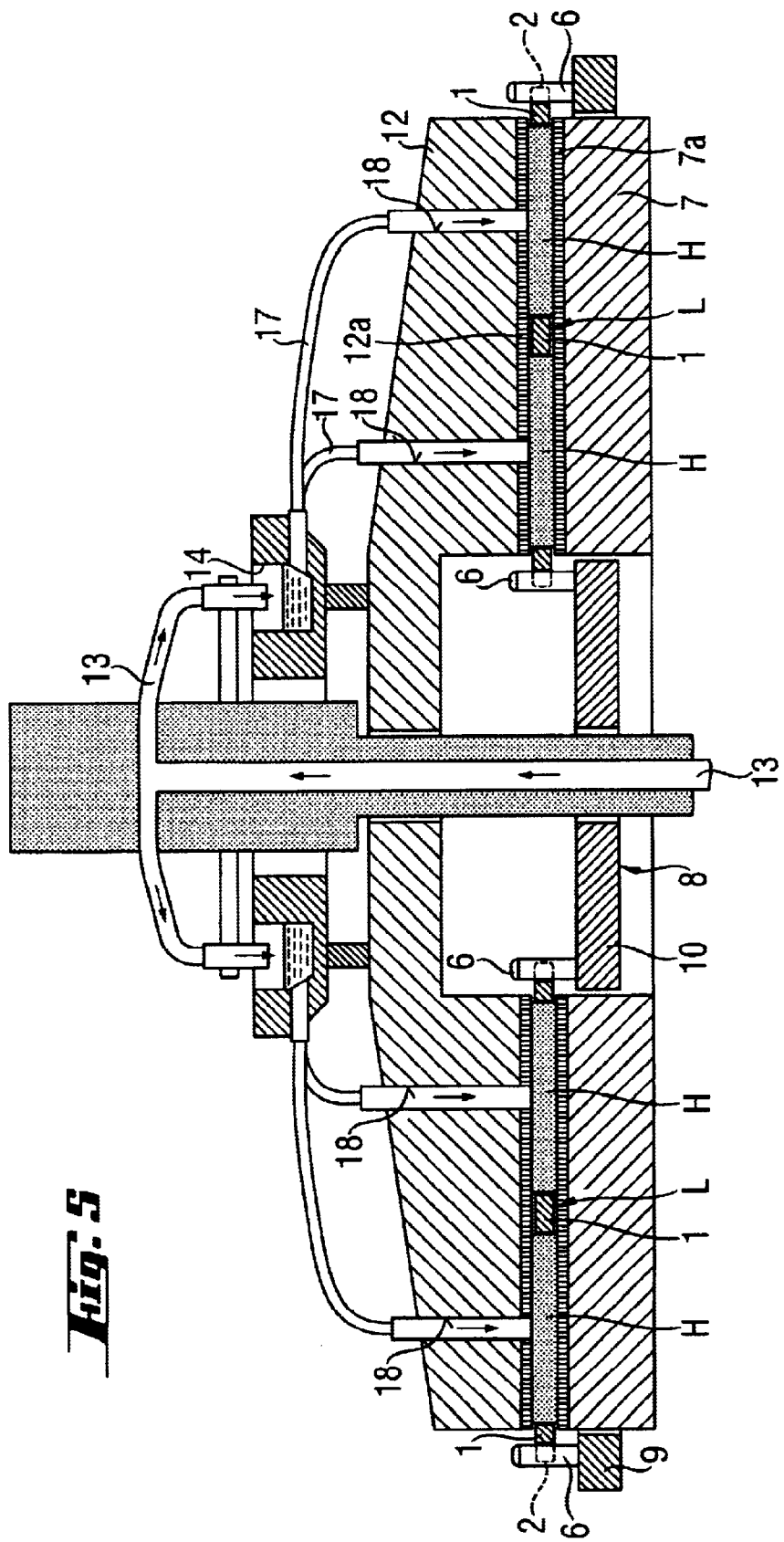

DOUBLE-SIDE POLISHING PROCESS WITH REDUCED SCRATCH RATE AND DEVICE FOR CARRYING OUT THE PROCESS

BACKGROUND OF THE INVENTION

1. Field of the Invention

The present invention relates to a double-side polishing process for semiconductor wafers, which are used in particular in industry for the fabrication of microelectronic components. The invention also relates to a device which is suitable for carrying out the process.

2. The Prior Art

Technological progress in the fabrication of microelectronic components, for example processors and memory components, requires the provision of single-crystal semiconductor wafers as a platform. These wafers have to satisfy increasingly stringent specifications. Specifications of this type relate to the crystal quality, and relate to the surface, in particular the front surface which is intended for component fabrication, and relate to the geometry and to the nanotopography of wafers of this type.

Conventional single-side polishing processes are no longer sufficient to produce semiconductor wafers which satisfy increasingly stringent geometry and nanotopography requirements. Moreover, the users of modern component processes increasingly demand not only a polished front surface on which the components are placed but also a polished back surface. This back surface binds fewer particles than, for example, an etched back surface. Therefore this back surface reduces the component failure rate caused by electric short circuits which are due to cross-contamination. For this reason, equipment and processes have been provided and developed further for the simultaneous polishing of front and back surfaces of the semiconductor wafer using what is known as the double-side polishing process. This equipment and these processes are nowadays being increasingly used in particular for the industrial manufacture of semiconductor wafers with diameters of 200 mm and 300 mm. The semiconductor wafers are moved in carriers made from metal or plastic, which carriers have suitably dimensioned cutouts. The carriers are moved over a path which is predetermined by the machine and process parameters between two rotating polishing plates. These plates are covered with polishing cloth, in the presence of a polishing abrasive, and as a result the wafers are polished, so that a high plane parallelism is achieved.

According to the prior art, which results, for example, from U.S. Pat. No. 4,974,370, the carriers are moved as follows. This is done either by means of an involute gear teeth, in which carrier gears and both outer and inner drive gears of the polishing machine come into engagement. Alternatively, this is done by pin wheel gears, in which case the carrier is surrounded by generally semicircular cutouts, in which pins of the outer and inner gears, belonging to drive gears, engage. During the polishing, the polishing abrasive flows continuously out of a stationary supply in the central axis of the polishing machine onto an open polishing-abrasive ring channel. This is attached to the upper polishing plate and therefore rotates, and from which it is passed, by means of hoses or tubes, through bores in the plate, to the semiconductor wafers which are to be polished.

As with single-side polishing processes, suitable polishing abrasives for double-side polishing are alkaline suspensions of abrasive substances, for example $SiO_2$ colloids in combination with alkaline components in water. Polishing abrasives of this type and their production, as well as suitable supply systems, are described, for example, in DE 197 15 974 A1, DE 198 17 087 A1, EP 959 116 A2 and U.S. Pat. No. 6,027,669.

A double-side polishing process for achieving improved planarity is described in 199 05 737 C2. By way of example, carriers made from chromium steel, which form the subject matter of the German patent application which bears the reference number DE 100 23 002.4, are suitable for this purpose. To avoid damage to the edges during polishing, it has proven appropriate to line the cutouts in the carriers which are intended to receive the semiconductor wafer with plastic, for example as described in EP 208 315 B1. However, different factors of influence, for example coagulation, and as a result crystallization of the polishing abrasive cause crystallites to form in the open supply under the action of ambient air. In addition, abrasion of polishing-abrasive deposits and extremely small metal particles can be formed on the drive gears and constantly cause scratches on the polished semiconductor wafers. These scratches can only be removed to a certain extent by expensive further polishing and lead to increased levels of scrap.

A person skilled in the art is aware that the treatment of polishing cloths by means of brush plates to clean away particles can be carried out between two polishing runs. In the case of double-side polishing, the use of this process has had only limited success, since there is a continuous supply of particles from the polishing-abrasive ring channel and/or from the gears. Manual cleaning of these components generally only provides a remedy for a short time.

EP 787 562 B1 has described a double-side polishing process which is distinguished by the fact that at least part of the carrier mount and of the pin or gear drive are produced from a hard resin material. Although this process reduces the risk of scratches being formed by metal particles, it has no effect on the formation of scratches caused by encrusted polishing abrasive flaking or being rubbed off. WO 00/39841 describes the storage of the carriers for double-side polishing under water between the polishing runs. This is done in order to prevent polishing abrasive from drying on the carriers, and therefore to prevent the formation of scratches, but the same restriction as that referred to above applies.

The prior art has not hitherto disclosed any process for the double-side polishing of semiconductor wafers which ensures a constantly low scratch rate.

SUMMARY OF THE INVENTION

It is therefore an object of the present invention to provide a process for the double-side polishing of semiconductor wafers which ensures a constantly low scratch rate.

The above object is achieved by the invention which provides a process for producing semiconductor wafers by double-sided polishing between two rotating, upper and lower polishing plates, which are covered with polishing cloth, while an alkaline polishing abrasive with colloidal solid fractions is being supplied, the semiconductor wafers being guided by carriers which have circumferential teeth and are set in rotation by complementary outer and inner gears of the polishing machine, in which the following process steps are simultaneously carried out during the polishing of the semiconductor wafers:

(a) at least one of the two sets of gears of the polishing machine is at least from time to time sprayed with a liquid which substantially comprises water, (b) the alkaline polishing abrasive is fed continuously to the semiconductor wafers in a closed supply device.

The present invention is further directed to a polishing machine for the double-sided polishing of semiconductor wafers, comprising an upper polishing plate and a lower polishing plate, each plate of which is covered with polishing cloth, carriers for receiving semiconductor wafers and a drive with external and internal gear teeth for turning the carriers, which machine has means for spraying at least one of the two sets of gears with a liquid and a closed system for supplying a polishing abrasive to the semiconductor wafers.

An essential feature of the invention is that, by preventing the polishing abrasive supplied from drying out, crystallization of the colloid, which leads to scratches being formed on the surfaces of the semiconductor wafers, is avoided. The fact that only the combination of the measures of (a) wetting of the outer and/or inner gear teeth of the polishing machine and (b) using a closed polishing-abrasive supply, which prevent the polishing abrasive from drying out, considerably reduces the scratch rate on the semiconductor wafers. This is unexpectedly surprising and was impossible to predict.

The starting material for the process is formed by using semiconductor wafers which are produced by sawing a semiconductor crystal, with rounded edges. The wafers are then subjected to one or more process steps such as lapping, grinding, etching and polishing. The end product of the process is double-side polished semiconductor wafers which, on account of a considerably reduced scratch rate, can be obtained in high yields on a large industrial scale and are therefore superior in terms of production costs to semiconductor wafers produced according to the prior art.

The process according to the invention can in principle be used to produce a body in wafer form which consists of a material which can be processed by the chemical mechanical double-side polishing process employed. Examples of such materials are silicon, silicon/germanium, silicon dioxide, silicon nitride and gallium arsenide. The use of silicon single crystal wafers is particularly preferred and forms the subject of the description which follows.

The silicon wafers which are produced by sawing up a silicon single crystal and rounding the edges can be subjected to various material-removing process steps before the double-side polishing process according to the invention is carried out. The purpose of these material-removing process steps is to improve the wafer geometry and to remove damaged surface layers and contamination. Suitable processes are lapping, grinding and etching. Wafers with polished surfaces can also be subjected to the process according to the invention. The preferred diameter of the silicon wafers which are to be polished is 150 to 450 mm.

A commercially available double-side polishing machine of suitable size can be used to carry out the polishing step according to the invention. The polishing machine substantially comprises a lower polishing plate, which can rotate freely in the horizontal plane, and an upper polishing plate, which can rotate freely in the horizontal plane, both of which plates are covered with a polishing cloth. This allows the double-sided abrasive polishing of silicon wafers with an alkaline polishing abrasive being supplied continuously. During the polishing, the silicon wafers are held on a geometric path which is determined by machine and process parameters. These wafers are held by carriers which have appropriately dimensioned cutouts for receiving these silicon wafers and have a thickness which is slightly less than that of the wafers.

The simultaneous use of at least three carriers is preferred. The simultaneous use of from four to six planar carriers made from stainless chromium steel is described in the German patent application which bears the reference numeral 100 23 002.4. Each carrier is loaded with at least three silicon wafers, and the edges of which are protected by polymer linings in the cutouts. This arrangement is particularly preferred. By way of example, it is possible, within the scope of the invention, to simultaneously polish 30 silicon wafers with a diameter of 200 mm (distributed over five carriers each holding six silicon wafers). It is also possible to polish simultaneously 15 silicon wafers with a diameter of 300 mm (distributed over five carriers each holding three silicon wafers).

The carriers are in contact with the polishing machine, for example by means of a pin wheel gear or an involute gear, via a rotating inner drive pin or gear ring and an outer drive pin or gear ring, which generally rotates in the opposite direction. As a result they are set in rotary motion between the two polishing plates. On account of the relative simplicity of exchanging pins which become worn through the constant action of the carrier flanks, the pin gear is preferred within the context of the invention in order to reduce the number of scratches. A further reason is that because of the optimized transmission of forces between the semicircular cutout of the carrier gear and the drive pins, which is optimized compared to that achieved with the sawtooth-like involute gear, the machine operates with fewer vibrations. Also it is therefore possible, by quicker rotation kinetics and a higher pressure, to achieve more advantageous material-removal rates during polishing, for example 0.8 to 1.5 mm/min. Drive pins which comprise a fixedly mounted pin and an exchangeable, secured, yet freely rotatable sleeve pushed over the pin, made from hardened VA steel, are particularly preferred.

Within the context of the invention, there is provision for the outer and/or inner drive ring of the polishing machine, which come into contact with the complementary gear teeth of the carriers, to be kept moist by spraying. This is done in order to counteract the deposition of polishing abrasive which dries out. This prevents the mechanical action of the carrier edges from detaching crystallites, for example of $SiO_2$, if a corresponding polishing abrasive is used. This prevents the crystallites from being carried between the upper and lower polishing plates, so that they could cause scratches on the silicon wafers. The spraying is preferably carried out continuously with ultrapure water, although it may also be stopped for brief periods during the polishing. The quantity of water supplied is such that there is no significant dilution of the polishing abrasive supplied as a result of the water being introduced into the polishing machine via the carriers. The provision of spray nozzles which are directed onto the gears or pin rings from above or at an oblique angle depends on the size of the polishing machine. Overall at least one nozzle is to be provided. By way of example, for a double-side polishing machine with a plate diameter of about 2 m, one to three nozzles are to be provided on the inside and two to five nozzles are to be provided on the outside.

Within the context of the invention, the polishing abrasive is supplied via a closed supply system. Compared to the open polishing-abrasive channels used in the prior art, a system of this type has the advantage that there are no significant encrustations of crystallized polishing abrasive which are washed between the polishing plates and may cause scratches. It is possible to use a closed polishing-abrasive ring channel which is acted on by pressure, and which is attached to the upper polishing plate. Therefore it rotates with the upper polishing plate and allows a forced transfer of the polishing abrasive, for example through hoses or tubes, through the upper polishing plate to the location of polishing. A design of this type is complex, since the polishing abrasive from the feed line, in the unmoving central part of the polishing machine, can only be transferred into the ring channel by rotary passages of complicated design.

A closed but unpressurized ring channel represents a simpler and therefore preferred design. In this case the polishing abrasive from the machine supply flows into the ring channel through the application of pressure. It then flows out of the ring channel and between the polishing plates on account of the force of gravity and centrifugal force. The ring channel, which rotates with the upper polishing plate, is covered by a cover. This cover is likewise in the form of a ring, but unlike the ring channel does not rotate and comes into contact particularly preferably via a liquid seal, which is particularly preferably filled with water. It is possible for the interior of the ring channel to be continuously or discontinuously sprayed with a liquid, preferably water. This spraying is by means of at least one nozzle which is attached, for example, to the underside of the non-rotating cover, although this is not absolutely imperative within the context of the invention.

Within the context of the statements which have been made above, the double-side polishing step is preferably carried out in the manner which is known to the person skilled in the art. Polishing preferably uses a commercially available polyurethane polishing cloth with a hardness of between 60 and 90 (Shore A), which particularly preferably has incorporated polyester fibers. For optimum distribution of the polishing abrasive between the upper and lower polishing plates, it is particularly preferable for at least the upper polishing cloth to be provided with a network of channels. These channels may, for example, be arranged in the manner of a chessboard, with a segment size of from 5 mm×5 mm to 50 mm×50 mm and a channel width and depth of from 0.5 to 2 mm. In the case of the polishing of silicon wafers, the continuous supply of a polishing abrasive with a pH of from 9 to 12, is set by the additions of alkali. This polishing abrasive comprises a colloid which particularly preferably comprises 0.5 to 10% by weight of $SiO_2$ in water. It may contain silica which, for example, is precipitated from water glass and/or produced pyrolytically from $Si(OH)_4$, and is recommended. After a certain number of polishing runs, for example after one to six polishing runs, it is recommended for the upper and lower polishing cloths to be brushed with brush plates. They are fitted instead of the carriers, for a period of, for example, 2 to 10 min while ultrapure water is being supplied, in order to prevent vitrification of the surface and to remove dirt particles.

The weight percent of $SiO_2$ in water is based upon the total weight of the polishing abrasive.

After the polishing has ended, any adhering polishing abrasive is cleaned off the silicon wafers, and the latter are dried and then examined for surface scratches under sharply focused light. Depending on their further purpose, it may be necessary for the wafer front surface to be subjected to surface polishing according to the prior art. For example this may be done by using a soft polishing cloth with the aid of an alkaline polishing abrasive based on $SiO_2$. It could also be desirable to apply an epitaxial coating of a semiconductor material, for example likewise of silicon. This is possible immediately after the double-side polishing has been carried out in accordance with the invention or after an additional surface polishing step, without problems.

The double-side polishing process according to the invention makes it possible to produce semiconductor wafers from silicon which satisfy the requirements for the fabrication of modern semiconductor components. In this process, when large quantities of wafers are produced, a reject rate caused by scratches of only 0.5 to 2% is observed if double-sided polishing is carried out with spraying of the outer and/or inner drive gear ring and with a closed supply of polishing abrasive. This leads to cost savings over processes of the prior art. A process according to the prior art without the inventive features, by contrast, leads to a scrap rate caused by scratches which is of the order of magnitude of 5% to 20%. This leads to higher production costs, for example through the need to reject the wafers or for complex further polishing without the guarantee of success and with the risk of an adverse effect on other quality parameters.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

Figures are used to explain an example and a comparative example, and the significance of these figures is explained below. In the drawing:

FIG. 4 diagrammatically shows the section denoted as A—A in FIG. 3 through the double-side polishing machine in an embodiment as has been used in the Example of the invention; and FIG. 5 shows an illustration corresponding to that shown in FIG. 4 of a double-side polishing machine according to the prior art, as has been used in the Comparative Example.

EXAMPLE AND COMPARATIVE EXAMPLE

Figure 1:
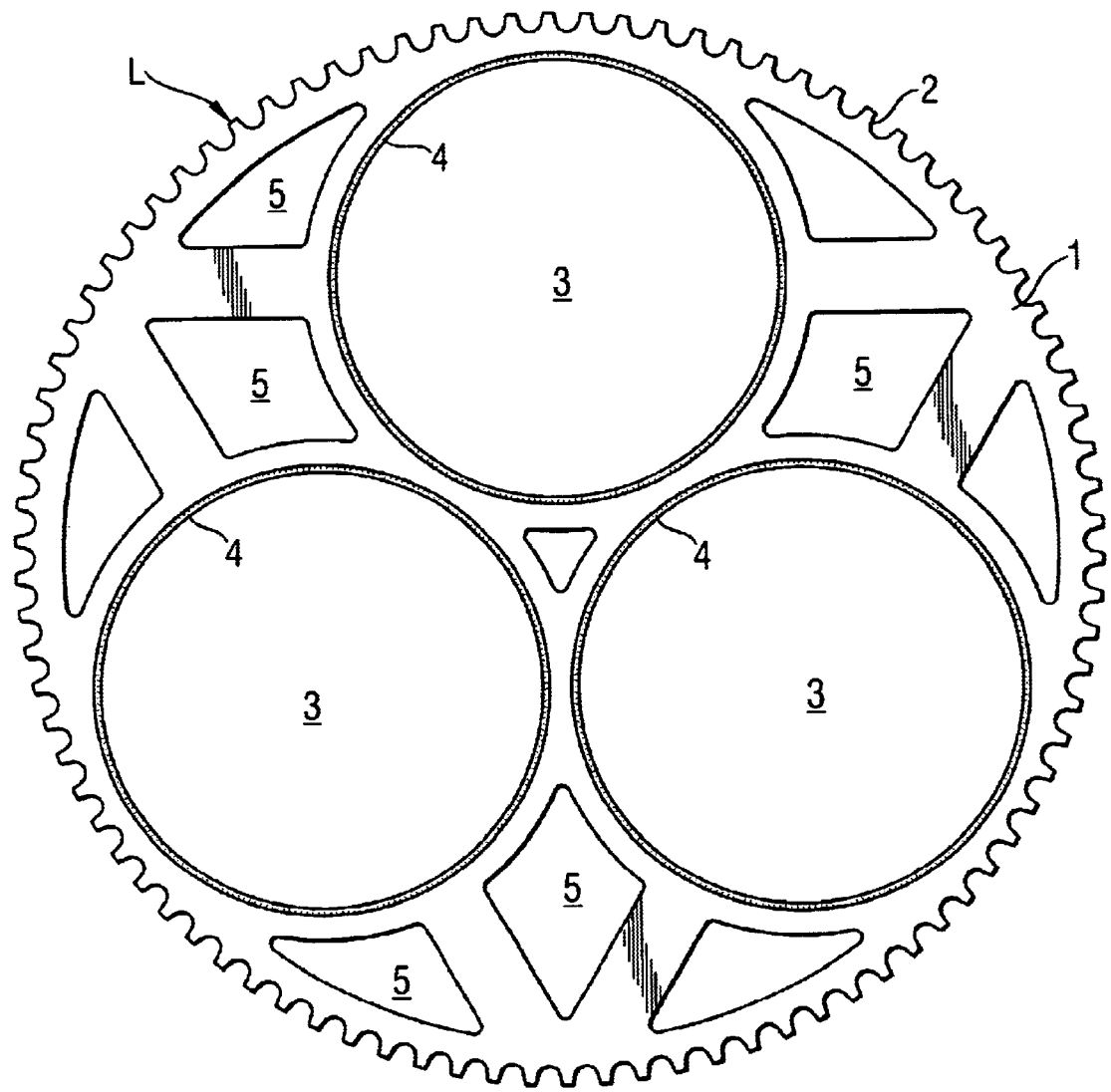
FIG. 1 diagrammatically shows a plan view of a carrier for the double-side polishing of 300-mm silicon wafers.
Figure 2:
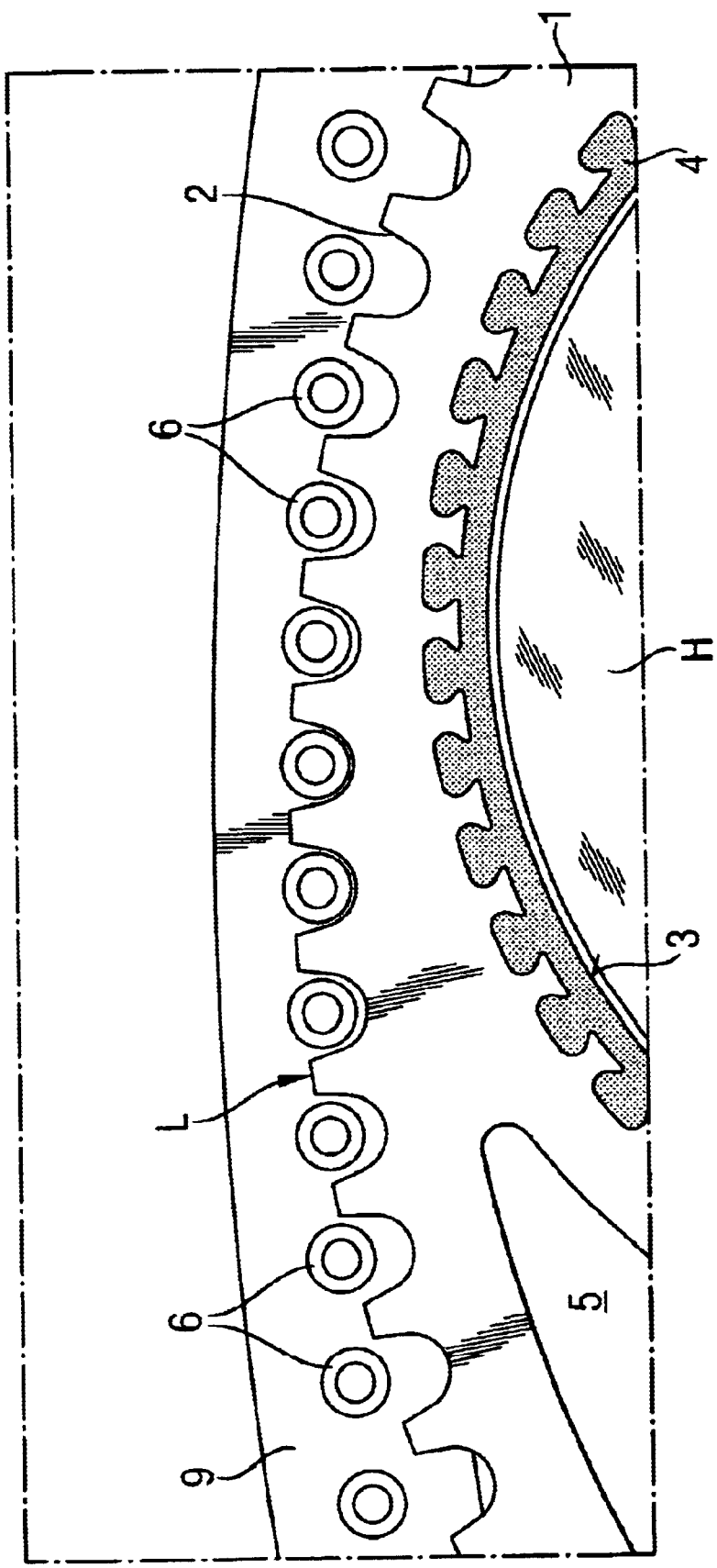
FIG. 2 diagrammatically shows a plan view of the engagement of the carrier in an external drive pin wheel of the double-side polishing machine.

Silicon wafers which had been edge-rounded, ground (removal of silicon 90 μm) and acid-etched in a mixture of concentrated nitric acid and hydrofluoric acid (silicon removal 20 μm), with a diameter of 300 mm and a thickness of 805 μm were available on a production scale for the Example and the Comparative Example. In addition, there were five carriers as shown in FIG. 1. The carriers L comprised a polished metal body 1 made from stainless chromium steel with a mean thickness of 770 μm, which had a circumferential ring gear 2 comprising semicircular cutouts, with which, as shown in FIG. 2, pins 6 of the outer and inner drive pin wheel of a double-side polishing machine engage, so that the carriers can be set in rotation. In each case three circular cutouts 3 which are arrange at regular intervals over a circular path were lined with frames 4 of polyvinylidene difluoride, which had an internal diameter of 301 mm and were of the same thickness as the carrier 1, were connected to the latter via pegs and were used to receive semiconductor wafers H, in this case silicon wafers. Furthermore, the carrier bodies 1 also had further cutouts 5, which were used to improve the distribution of polishing agent during the polishing.

Figure 3:
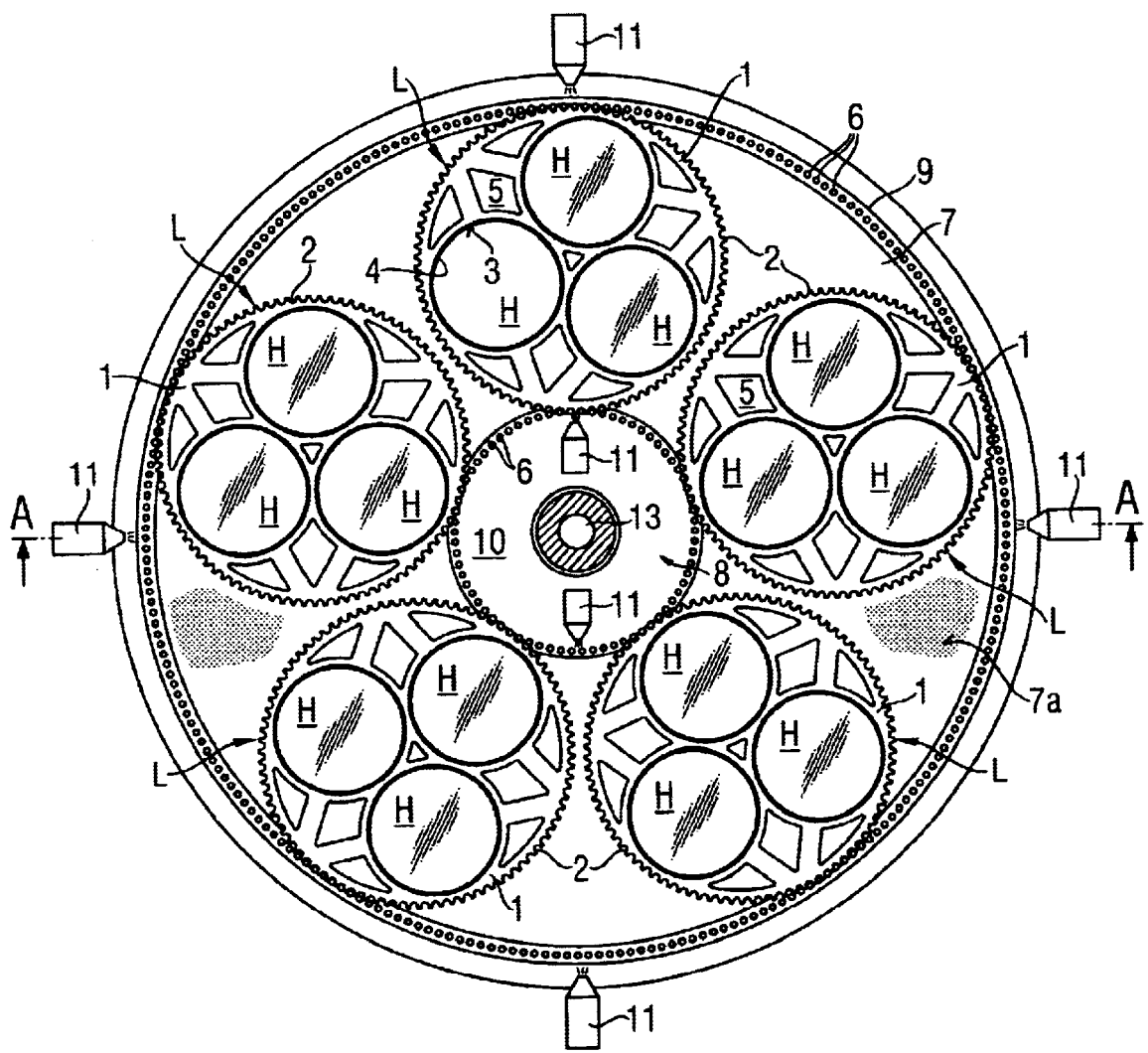
FIG. 3 diagrammatically shows a plan view of an opened double-side polishing machine for the simultaneous polishing of fifteen 300-mm silicon wafers in an embodiment as is used in the Example of the invention.

To polish the silicon wafers, a commercially available double-side polishing machine was used, the dimensions of which were such that the simultaneous use of five carriers L as shown in FIG. 1 and therefore the simultaneous polishing of 15 silicon wafers was possible. FIG. 3 shows the lower plate 7, which is covered with polishing cloth, together with the carriers L which had been loaded with silicon wafers H, in plan view. The polishing machine had an outer drive pin wheel 9 and a sun gear 8 with an inner pin wheel 10. These wheels rotate in opposite directions and thereby cause the carriers 1 to rotate, with the result that the silicon wafers H moved over a planetary path during the polishing. The pins 6 comprise inner pins which had been screwed into corresponding drilled holes of the drives 9 and 10 and were covered with fitted sleeves made from VA steel, which were able to rotate freely while the carriers L were being driven and were secured against slipping by matching cover caps. The wear caused by interaction with the flanks of the carriers L during the polishing meant that it was necessary for the sleeves of the pins 6 to be easy to exchange after about one year of fully continuous production.

FIG. 3 and FIG. 4 relate to the embodiment of the Example. The spray nozzles 11, which are characteristic of the invention and, for illustration purposes, are shown on an enlarged scale and not in the correct projection in FIG. 3. These spray nozzles 11 were secured and arranged on the nonrotatable machine body in such a way that they continuously sprayed in each case 30 ml/min of ultrapure water onto the gear teeth at an angle which was deflected approximately 20° away from the vertical. Four nozzles were directed onto the outer drive ring 9, and two nozzles were directed onto the inner gear ring 10.

FIG. 4 shows a section view along line A—A in FIG. 3 through the double-side polishing machine used to carry out the invention. All the machine parts which are hatched in the diagrammatic drawing rotated during polishing, the direction of hatching indicating the direction of rotation. The lower polishing plate 7 covered with polishing cloth 7a moved in the opposite direction to the upper polishing plate 12 covered with polishing cloth 12a. The sun gear 8 having the pins 6 of the inner pin wheel gear 10 moved in the opposite direction to the outer drive ring gear 9 with pins 6. (For clarity, silicon wafers H, carriers L, polishing cloths 7a, 12a and pins 6 are illustrated on an exaggerated scale in FIG. 4.)

The design of the second feature which is characteristic of the invention, namely a closed polishing-agent supply, can be seen from components 13 to 18. The polishing agent, which was prepared according to the prior art by an inherently closed polishing-agent mixing station, was passed, for example by the action of compressed air, via a nonrotating feed. The polishing agent was guided through the center axis of the polishing machine, with a lateral branch 13, into a polishing-agent ring channel 14, which is attached to the upper polishing plate and rotates with the latter during polishing. The polishing-agent ring channel 14 has in each case one encircling outer and inner recess 16, which is suitable to receive water and a cover 15 which is likewise in the form of a ring and is attached to the central part of the polishing machine, and therefore does not rotate.

The water in the two recesses 16, which can be exchanged via an inlet and outlet device (not shown) when required, during the polishing, when the polishing-abrasive supply 13 and cover 15 do not rotate and polishing abrasive runs into the rotating polishing-abrasive ring channel 14, acts as a liquid seal. This liquid seal prevents ambient air from acting on the polishing abrasive in the polishing-abrasive ring channel 14 and associated drying out of the polishing abrasive, which leads to the harmful formation of $SiO_2$ crystallites. A combination of the force of gravity and rotationally induced centrifugal force causes the polishing abrasive to pass into a large number of feeds 17, in the case of the example polyethylene tubes, and, from there, through polyethylene-lined bores 18 in the upper polishing plate 12 to the silicon wafers H. The feeds 17 and bores 18 are distributed over the upper polishing plate 12 in such a way that a uniform distribution of polishing abrasive is achieved between the polishing cloths 7a, 12a; the number is substantially dependent on the size of the polishing machine.

FIG. 5 relates to the embodiment of the comparative example and shows an illustration which corresponds to that shown in FIG. 4 of a double-side polishing machine, which is otherwise of the same construction, for a process according to the prior art, which is fitted without the features of ring spraying 11 and polishing-abrasive ring channel cover 15 with liquid seal 16.

The double-side polishing step was carried out with a polyurethane cloth 7a, 12a of Shore A hardness 74 which was reinforced with polyester fibers and, after cleaning of the lower and upper cast-iron polishing plates 7, 12, was attached without any bubbles by means of a pressure-adhesive system. The lower polishing cloth 7a had a flat surface, and the surface of the upper polishing cloth 12a had a chessboard-like pattern of milled channels with a width of 1.5 mm and a depth of 0.5 mm, with the profile of a sector of a circle. The channels were arranged at regular intervals of 30 mm. The polishing of the fifteen 300-mm silicon wafers took place using a polishing abrasive which had been adjusted to a pH of 11.2 by additions of $K_2CO_3$ and KOH and comprised a colloid of precipitated silica with an $SiO_2$ solids content of 3% by weight, 5 l/min of polishing abrasive being supplied. A polishing pressure of 0.20 bar, a polishing-plate rotation of 20 or −20 rpm and a carrier rotation of 15 rpm and the carrier translation of 1 rpm were established for the polishing, so that a removal rate of 1.0 $\mu$m of silicon per min resulted at a plate temperature of in each case 40° C.

After 30 $\mu$m of silicon had been removed by the polishing, the silicon wafers from each polishing run were cleaned and dried. In a fully continuous production of 300-mm silicon wafers, a double-side polishing machine which was fitted according to the invention as shown in FIG. 4, and a further machine which was fitted according to the prior art as shown in FIG. 5, were operated for a period of three months. During this 3 months period approximately 25,000 wafers were polished on each of the two machines. After every fourth polishing run, the polishing cloths were brushed with ultra-pure water for a period of 6 min. Three brush plates were available for this purpose and had the same teeth 2 and the same diameter as the carriers L, but comprised a 15-mm thick base body made from polyvinyl chloride, into which a large number of bundles of nylon bristles, each with a diameter of 5 mm, had been fitted. The polishing cloths 7a, 12a were renewed after on average 400 polishing runs, the criterion used for this replacement being when the removal rate fell below 0.9 $\mu$m/min.

All the silicon wafers which had been polished in this way were subjected to visual inspection for scratches under sharply focused light; a darkened room was available for this purpose. 1.4% of the 300-mm silicon wafers which had been polished according to the invention on the polishing machine shown in FIG. 4 were scratched, while 12.9% of the wafers which had been polished on the polishing machine according to the prior art, as shown in FIG. 5, were scratched.

Accordingly, while a few embodiments of the present invention have been shown and described, it is to be understood that many changes and modifications may be made thereunto without departing from the spirit and scope of the invention as defined in the appended claims.

What is claimed is:

1. A process for producing semiconductor wafers comprising double-sided polishing of semiconductor wafers between two rotating, upper and lower polishing plates, which are covered with polishing cloth, while supplying an alkaline polishing abrasive with colloidal solid fractions;

said semiconductor wafers being guided by carriers which have circumferential gear teeth and said carriers are rotating by complementary outer gear teeth and inner gear teeth of the polishing machine;

the following process steps are simultaneously carried out during the polishing of the semiconductor wafers:
  (a) spraying at least one of the two sets of gear teeth of the polishing machine at least from time to time with a liquid which substantially comprises water; and
  (b) feeding the alkaline polishing abrasive continuously to the semiconductor wafers in a closed supply device; and guiding the polishing abrasive without pressure, via a covered, rotating polishing-abrasive ring channel attached to the upper polishing plate, to the semiconductor wafers.

2. The process as claimed in claim 1, wherein the polishing abrasive comprises a colloidal solution of 0.5 to 10% by weight of $SiO_2$ and has a pH of from 9 to 12; and wherein the percent by weight of $SiO_2$ is based upon the total weight of the polishing abrasive.

3. The process as claimed in claim 1, wherein an overall quantity of from 2 to 50 $\mu$m of material is polished off the semiconductor wafers.

4. The process as claimed in claim 1, wherein the polishing cloths of the lower and upper polishing plates have a Shore A hardness of from 60 to 90; and at least the polishing cloth of the upper polishing plate has a surface with is interrupted by channels.

5. The process as claimed in claim 1, wherein the gear of the polishing machine is a pin wheel gear.

6. The process as claimed in claim 1, wherein the carriers comprise stainless chromium steel and have plastic linings in cutouts for receiving the semiconductor wafers.

7. The process as claimed in of claim 1, wherein at least three carriers which are loaded with semiconductor wafers are located in the polishing machine during the polishing.

8. The process as claimed in claim 1, comprising spraying the outer gear teeth and inner gear teeth with ultrapure water; and the spraying taking place at at least two locations of the outer gear teeth and at least one location of the inner gear teeth.

9. The process as claimed in claim 1, wherein the covering of the polishing-abrasive ring channel does not rotate and seals the ring channel with respect to ambient air by means of a liquid seal which is substantially filled with water.

10. The process as claimed in claim 1, wherein the semiconductor wafers which are to be polished substantially comprise silicon and have diameters of from 150 mm to 450 mm.

11. The process as claimed in claim 10, comprising providing the silicon wafers by sawing up a silicon single crystal, followed by rounding of the wafer edges; and at least one step selected from the group consisting of grinding, lapping and wet-chemical etching.

* * * * *